US007437813B2

(12) United States Patent
Tunaboylu et al.

(10) Patent No.: US 7,437,813 B2
(45) Date of Patent: Oct. 21, 2008

(54) PROBE REPAIR METHODS

(75) Inventors: Bahadir Tunaboylu, Chandler, AZ (US); John McGlory, Chandler, AZ (US); Horst Clauberg, Warminster, PA (US); Bruce Griffing, North Wales, PA (US); Robert E. Werner, Chalfont, PA (US); Edward T. Laurent, Ambler, PA (US); Edward L. Malantonio, Conshohocken, PA (US); Alan Slopey, Warrington, PA (US); Paul Bereznycky, Medford, NJ (US)

(73) Assignee: SV Probe Pte Ltd., Singapore (SG)

( * ) Notice: Subject to any disclaimer, the term of this patent is extended or adjusted under 35 U.S.C. 154(b) by 84 days.

(21) Appl. No.: 11/704,016

(22) Filed: Feb. 7, 2007

(65) Prior Publication Data
US 2007/0200577 A1 Aug. 30, 2007

Related U.S. Application Data

(60) Provisional application No. 60/771,340, filed on Feb. 8, 2006.

(51) Int. Cl.
*B23P 6/00* (2006.01)
*H05K 3/02* (2006.01)
*G01R 31/02* (2006.01)

(52) U.S. Cl. .............. 29/402.13; 29/402.01; 29/402.03; 29/402.06; 29/402.08; 29/846; 29/847; 324/754

(58) Field of Classification Search .................. 29/842, 29/846, 847, 402.01, 402.03, 402.06, 40.08, 29/402.13; 324/754
See application file for complete search history.

(56) References Cited

U.S. PATENT DOCUMENTS

| 6,436,802 | B1* | 8/2002 | Khoury ....................... 438/612 |
| 6,452,407 | B2* | 9/2002 | Khoury et al. .............. 324/754 |
| 6,777,319 | B2* | 8/2004 | Grube et al. ................. 438/612 |
| 6,799,976 | B1* | 10/2004 | Mok et al. .................... 439/55 |
| 6,815,961 | B2* | 11/2004 | Mok et al. ................... 324/754 |

(Continued)

OTHER PUBLICATIONS

European Patent Office, "Notification of Transmittal of The International Search Report and The Written Opinion of The International Searching Authority, or The Seclaration", International Application No. PCT/US2007/003475, dated Sep. 5, 2007, 12 pages.

(Continued)

*Primary Examiner*—C. J. Arbes
(74) *Attorney, Agent, or Firm*—Hickman Palermo Truong & Becker LLP; Edward A. Becker

(57) ABSTRACT

A method and apparatus for repairing a probe on a probe card is provided. A plurality of beams is formed on a beam panel. The plurality of beams includes a replacement beam. After identifying a damaged beam on the probe card, the damaged beam is removed from the probe card. The beam panel is aligned with the probe card. After the beam panel is aligned, the aligned beam panel is temporarily affixed to the probe card. After the beam panel is temporarily affixed to the probe card, the replacement beam is affixed at a location previously occupied by the damaged beam. After the replacement beam is affixed at the location, the beam panel is removed from the probe card.

10 Claims, 7 Drawing Sheets

U.S. PATENT DOCUMENTS

| | | | |
|---|---|---|---|
| 7,068,057 B2* | 6/2006 | Tervo et al. | 324/762 |
| 7,178,236 B2* | 2/2007 | Gleason et al. | 29/874 |
| 2001/0009376 A1 | 7/2001 | Takekoshi et al. | |
| 2002/0194730 A1 | 12/2002 | Shih et al. | |
| 2003/0113990 A1* | 6/2003 | Grube et al. | 438/612 |
| 2005/0179456 A1 | 8/2005 | Beaman et al. | |

OTHER PUBLICATIONS

Claims, International application No. PCT/US2007/003475, 2 pages.

* cited by examiner

PROBE REPAIR METHODS

RELATED APPLICATION DATA

This application claims the benefit of, and priority to, U.S. Provisional Patent Application No. 60/771,340, entitled Probe Repair Methods, filed on Feb. 8, 2006, the contents of which are incorporated by reference for all purposes as if fully set forth herein.

FIELD OF THE INVENTION

The present invention relates to approaches for repairing probes of a probe card.

BACKGROUND

It is not uncommon for one or more beams and/or posts to become damaged in some fashion during the manufacture of a probe card, for example, a cantilever probe card. Such beams or posts need to be replaced to repair or salvage the cantilever probe card.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments of the present invention are illustrated by way of example, and not by way of limitation, in the figures of the accompanying drawings and in which like reference numerals refer to similar elements and in which.

DETAILED DESCRIPTION

Figure 1A:
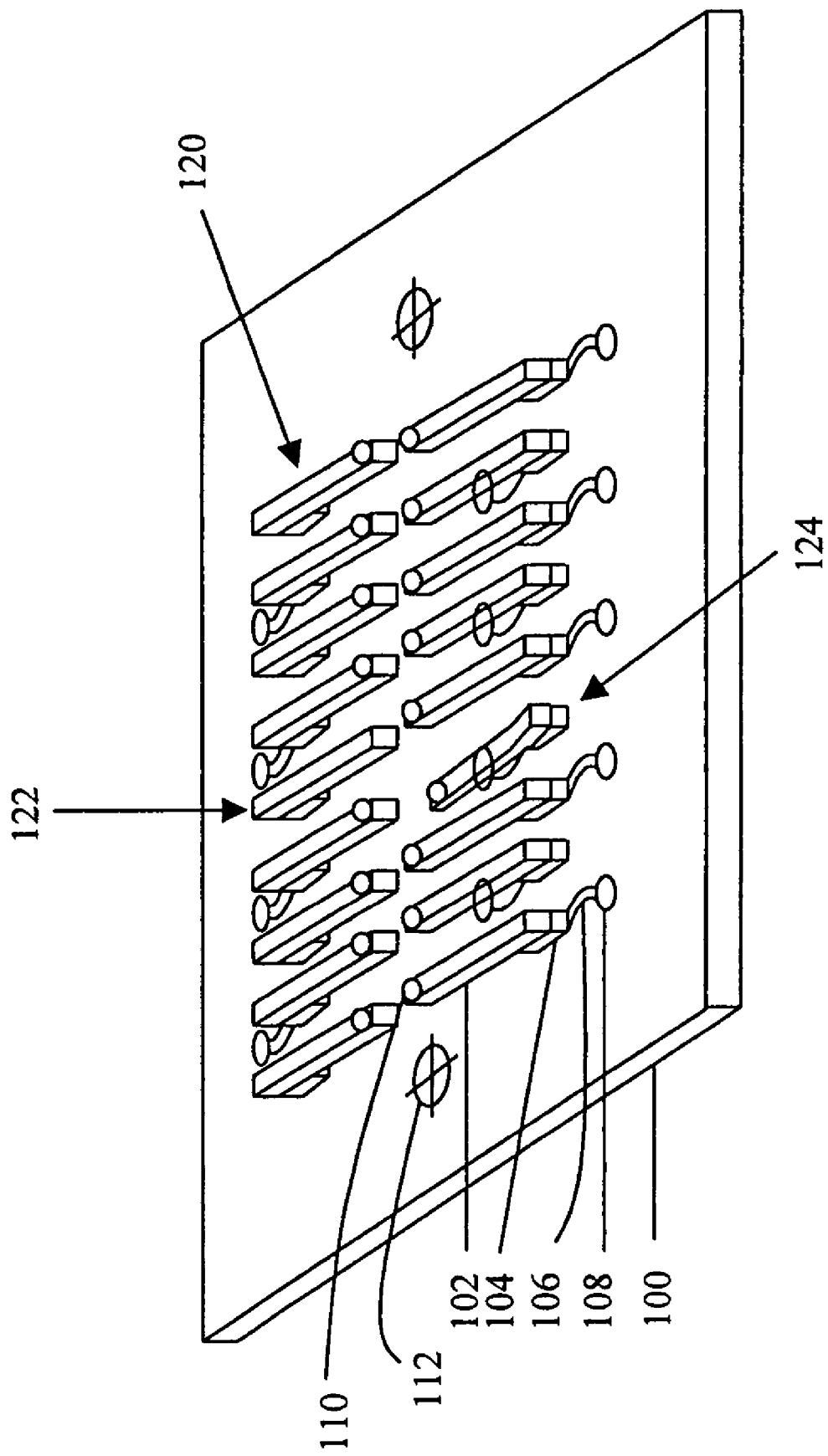
FIG. 1A is a perspective view of a beam-mounted-post substrate with damaged beams/tips.

In the following description, for the purposes of explanation, numerous specific details are set forth in order to provide a thorough understanding of the embodiments of invention described herein. It will be apparent, however, that the embodiments of invention described herein may be practiced without these specific details. In other instances, well-known structures and devices are shown in block diagram form in order to avoid unnecessarily obscuring the embodiments of invention described herein.

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. In the description, relative terms such as "horizontal," "vertical," "up," "down," "top," and "bottom" as well as derivatives thereof (for example, "horizontally," "downwardly," "upwardly," etc.) should be construed to refer to the orientation as then described or as shown in the drawing figure under discussion unless otherwise specifically described. These relative terms are for convenience of description and normally are not intended to require a particular orientation. Terms "inwardly," "outwardly," "longitudinal" versus "lateral" and the like are to be interpreted relative to one another or relative to an axis of elongation, or an axis or center of rotation, as appropriate. Terms such as "connected" and "interconnected" refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship.

As used herein, a "probe card" is broadly used herein, shall refer to anything which may be attached to a probe, such as a probe card assembly, a substrate, or any other structure.

In an embodiment for repairing a probe on a probe card, a plurality of beams is formed on a beam panel. The plurality of beams includes a replacement beam. After identifying a damaged beam on the probe card, the damaged beam is removed from the probe card. The beam panel is aligned with the probe card. After the beam panel is aligned, the aligned beam panel is temporarily affixed to the probe card. Afterwards, the replacement beam is affixed at a location previously occupied by the damaged beam. After the replacement beam is affixed at the location, the beam panel is removed from the probe card.

FIG. 1A is a perspective view of beam-mounted-post substrate 100 having a series of cantilever probes 120 connected thereto. Each probe 120 comprises beam 102 with optional tip 110 connected thereto at an upper surface proximate a distal end of the beam. Beam 102 may be coated with a coating, such as gold. Beam 102 is connected to post 104 at the beam's lower surface at the end opposite tip 110. Post 104 is connected to a distal end of trace 106 which in turn is connected to an electrically conductive terminal/pad 108. If any beams 102/tips 110 are damaged, they may be reworked or replaced by removing them and tab bonding new (tipped) beams in their place. For example, beam 122 has a missing tip and beam 124 is damaged such that both beams 122, 124 are desired to be replaced.

It is noted that not all terminals/pads 102 and traces 106 are shown in FIGS. 1A (and 1B) for ease of illustration and some beams 102 are in partial phantom to show the underlying pads/terminals 108.

Beam-mounted-post substrate 100 may be, for example, a multi-layer organic (MLO) or multi-layer ceramic (MLC). In a particular example, substrate 100 may be a space transformer. Beam-mounted-post substrate 100 may include at least a pair of alignment features 112 such as apertures or protrusions. Terminals 108 (e.g., conductive pads/vias/terminals, etc.) are adjacent a surface of substrate 100. Traces 106 may be plated using processes such as, for example, lithographic processes, such as, for example, photolithographic or X-ray lithographic processes, etc. Conductive traces 106 may be comprised of a conductive metal, such as copper (Cu). Posts 104 may be formed separately and then connected to traces 106 by tab bonding or by plating using processes such as lithographic processes, which may include photolithographic, stereolithographic, or X-ray lithographic processes.

Posts 104 and beams 102 may each be comprised of, for example, nickel manganese, nickel, beryllium-nickel, platinum, palladium, tungsten (W), tungsten-rhenium (WRe), rhenium copper (ReCu), beryllium copper (BeCu), steel alloys including stainless steel or Paliney® 7, a precious-metal alloy comprised of gold, palladium, platinum, silver, copper and zinc (Paliney® is a registered trademark of the J. M. Ney Company, Ney Industrial Park, 2 Douglass Street, Bloomfield, Conn. 06002). Post 104 and beam 102 may also be coated with a coating, such as gold (Au). Tips 110 may be stud bumps and may be comprised of, for example, platinum iridium (PtIr), platinum (Pt), platinum alloys, palladium (Pd) or palladium alloys gold (Au), copper (Cu) or silver (Ag).

Figure 1B:
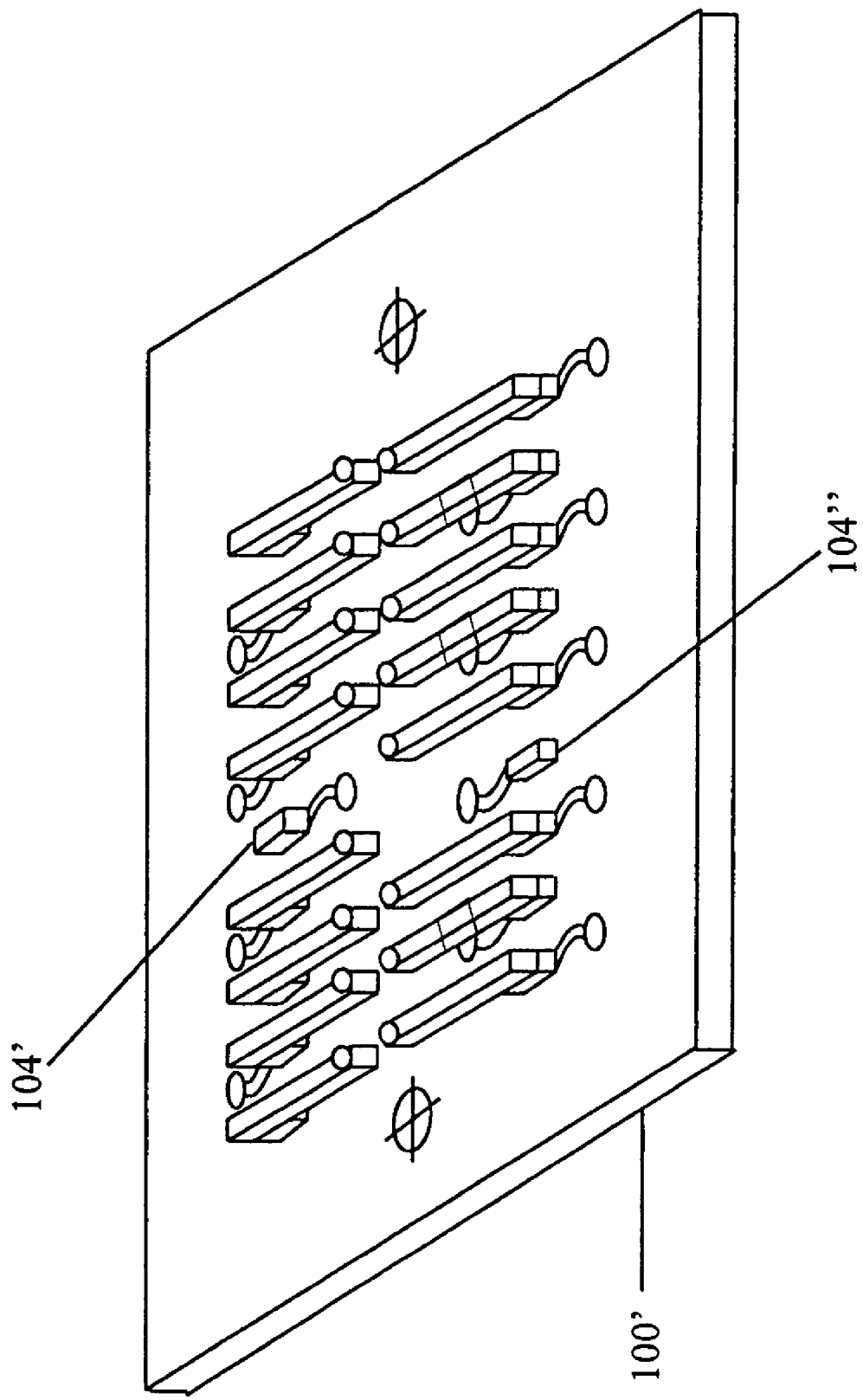
FIG. 1B is a perspective view of an exemplary beam-mounted-post substrate with damaged beams/tips removed according to an embodiment of the invention.

As shown in FIG. 1B, which depicts an embodiment of the invention, beams 122 and 124 are selectively removed leaving their respective posts 104', 104" exposed. For example, beams 122, 124 may be removed by pulling them off their respective posts 104', 104". Beams 122 and 124 may be selected for removal because beams 122 and 124 are deemed to be damaged or in need of repair. After the removal of damaged beams, the structure 100' may be cleaned as necessary.

Figure 2A:
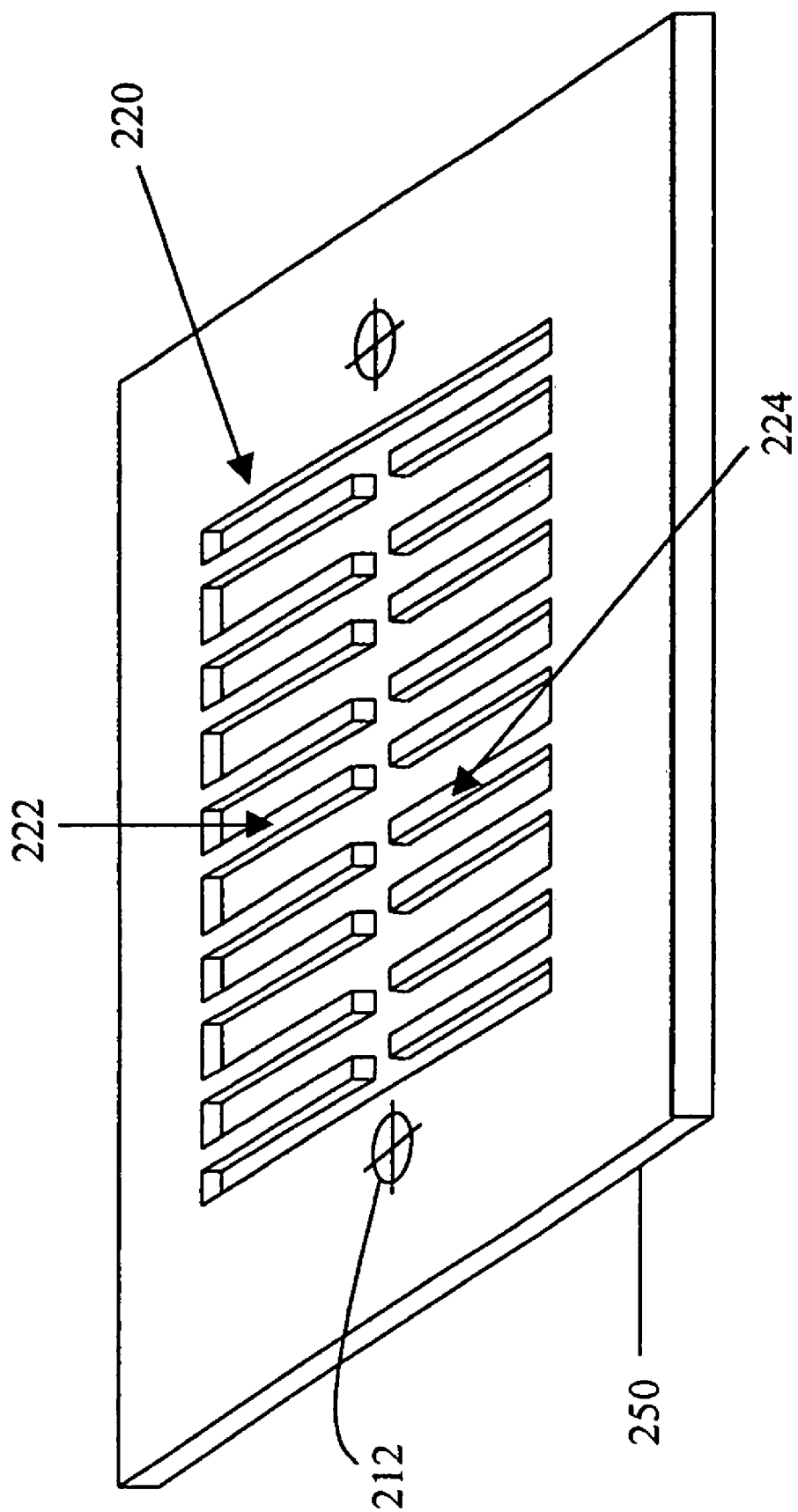
FIG. 2A is a perspective view of a beam panel according to an embodiment of the invention.

As shown in FIG. 2A, which depicts an embodiment of the invention, a separate beam panel 250 is shown. Beam panel 250 includes an array of beams 220, 222, 224 that corresponds to respective posts 104, 104', 104" on beam-mounted-post substrate 100, 100' of FIGS. 1A and 1B (with beams 222, 224 destined to be connected to respective posts 104', 104" as described in further detail below). Beam panel 250 may be formed on a reusable support structure (not shown) such as a stainless steel support structure. A seed metal layer, such as, for example, a copper seed layer, may be formed on the stainless steel structure before formation of beam panel 250. Beam panel 250/beams 220 may be formed by plating using processes such as, for example, lithographic processes, such as, for example, photolithographic, stereolithographic, or X-ray lithographic processes. Once beams 220 are formed, beam panel 250 may be removed from the underlying support structure by, for example, peeling. Beams 220 may then be plated with a coating, such as gold (Au), on all exposed sides. Beams 220 may be comprised of the same material as beams 102 on beam-mounted-post substrate 100. There may or may not be additional structural features (not shown) between beams 220, 222, 224 and beam panel 250 as a whole and/or between beams 220, 222, 224. These structures may provide added mechanical support to beams 220, 222, 224/beam panel 250 during processing and may further assist in maintaining alignment of beams 222, 224 during processing/connection to respective exposed posts 104', 104".

Beam panel 250 includes at least a pair of alignment features 212 that may be opposite in kind to alignment features 112, for example, protrusions, apertures, etc. such that alignment features 112, 212 are adapted for interconnection there between to assist/cause proper alignment between beam-mounted-post substrate 100 and beam panel 250 when joined as described below. For example, beam alignment features 212 may be apertures/holes and beam-mounted-post substrate alignment features 112 may be posts/protrusions/fiducial eye points adapted for at least partial receipt within apertures/holes 212.

Figure 2B:
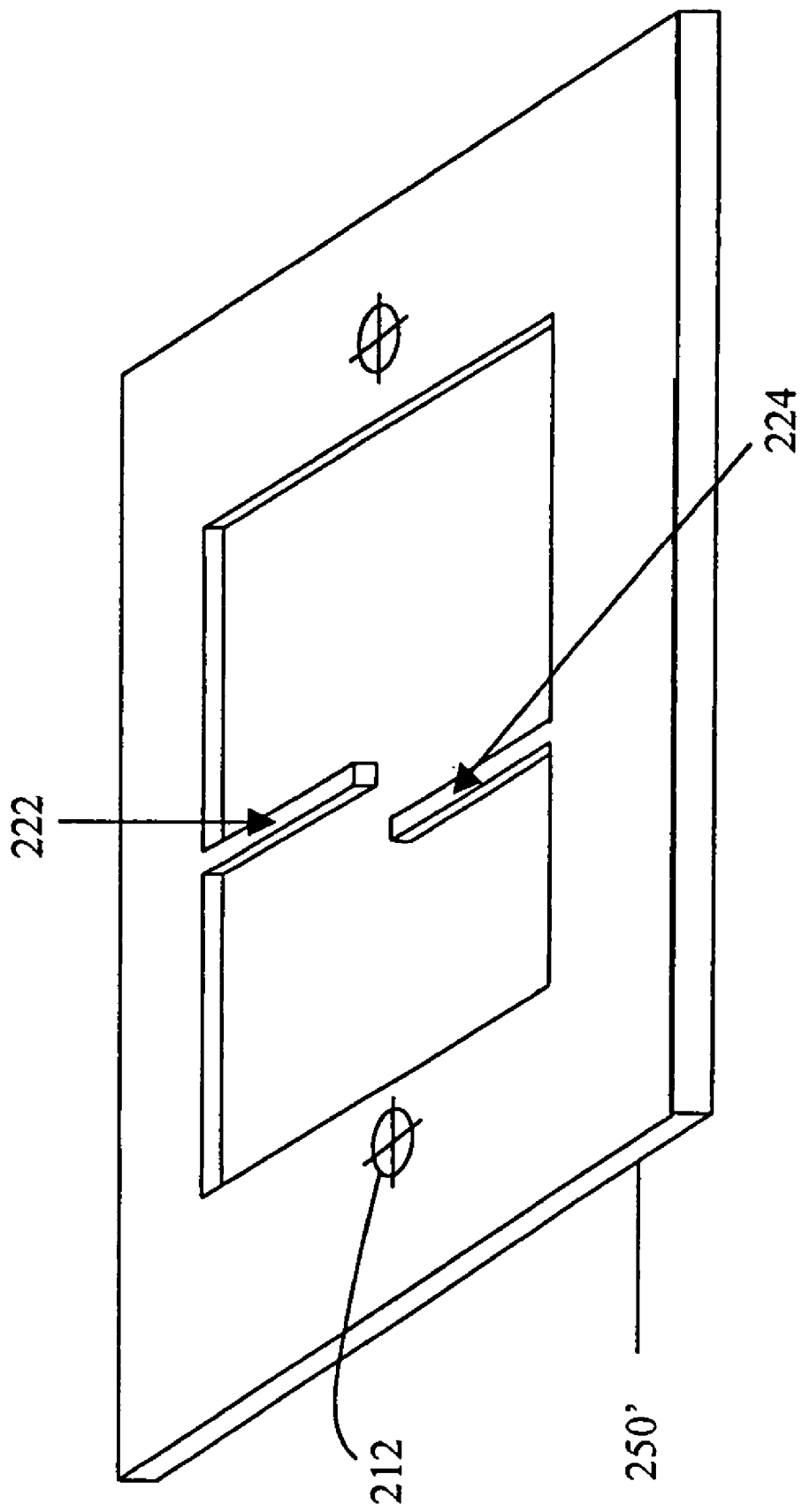
FIG. 2B is a perspective view of a beam panel with only replacement beams according to an embodiment of the invention.
Figure 2C:
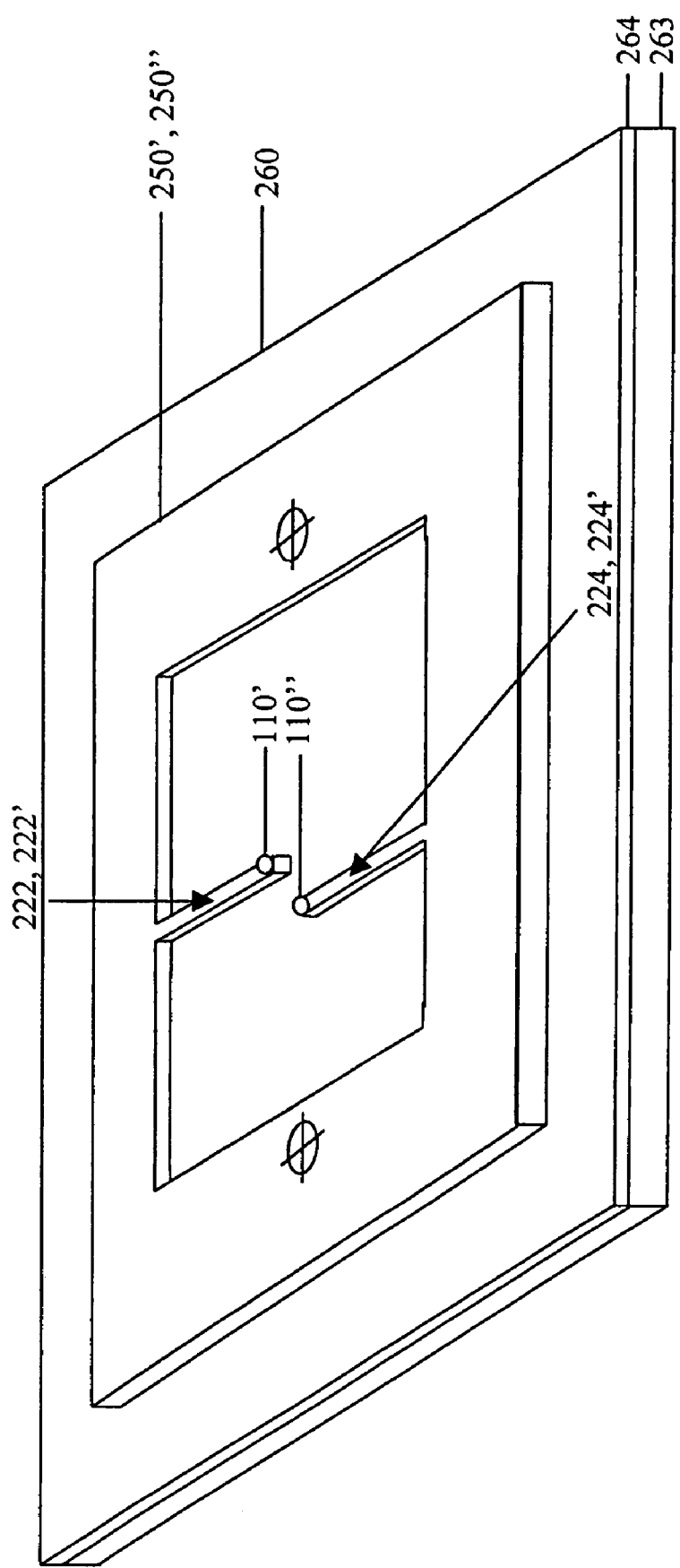
FIG. 2C is the beam panel of FIG. 2B mounted to a support structure according to an embodiment of the invention.

As shown in FIG. 2B, which depicts an embodiment of the invention, all beams 220 except for those beams 222, 224 corresponding to, and to be connected to, exposed beams 104', 104" (replacing removed beams 122, 124) are removed, leaving replacement beam panel 250'. It is contemplated that some additional structural features (see above) may remain, or may be added, to provide additional structural support to replacement beams 222, 224. Further, the beam panel illustrated in FIG. 2B may be formed (e.g., plated) to include only the desired beams (i.e., beams 222 and 224) such that other beams do not need to be removed. Typically all beams are bumped to generate tips and unwanted beams are simply cut or otherwise removed from the panel to obtain the donor beam panel for repair as shown in FIG. 2C. That is, more full panels may be initially produced and some are used for build and some are used for repair.

As shown in FIG. 2C, which depicts an embodiment of the invention, replacement beam panel 250' is mounted to tip support structure 260 which may provide support for formation of (optional) tips 110' 110" proximate the distal ends of beams 222, 224 to formed tipped replacement beams 222', 224'. Tip support structure 260 may be comprised of, for example, stainless steel sheet 263 (or other material having a coefficient of thermal expansion (Cte) similar to the beam panel material) that may be coated with, for example, spun-on polyimide or other photoresist layer 264. Tips 110', 110" may be formed by, for example, by methods/processes discloses in pending U.S. patent application Ser. No. 11/211,994, which is incorporated herein in its entirety. Replacement beam panel 250' may then be separated from tip support structure 260, e.g., by etching to release tipped replacement beam panel 250" from support structure coating 264.

Figure 3A:
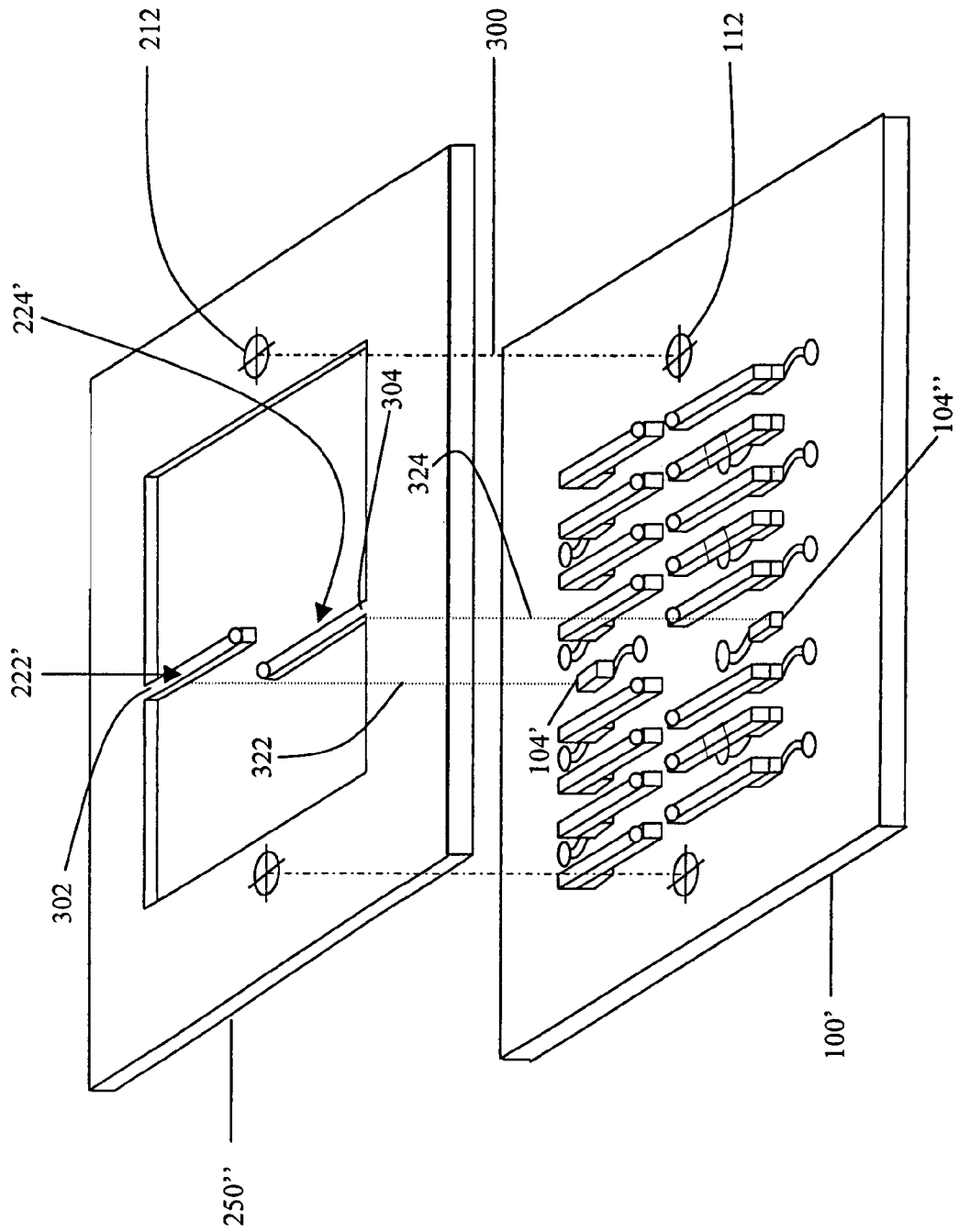
FIGS. 3A and 3B are illustrations showing the beam panel of FIG. 2C being aligned and connected to the beam-mounted-post substrate of FIG. 1B according to an embodiment of the invention.

As shown in FIG. 3A, in an exemplary embodiment of the present invention, tipped replacement beam panel 250" is aligned over, for example, beam-mounted-post structure 100' as at 300 using respective alignment features 212, 112. It is noted that tipped replacement beams 222', 224' are therefore also aligned with exposed posts 104', 104" as at 322, 324, respectively. Tipped replacement beam panel 250" and beam-mounted-post structure 100' may be aligned using, for example, an alignment tool (not shown).

Figure 3B:
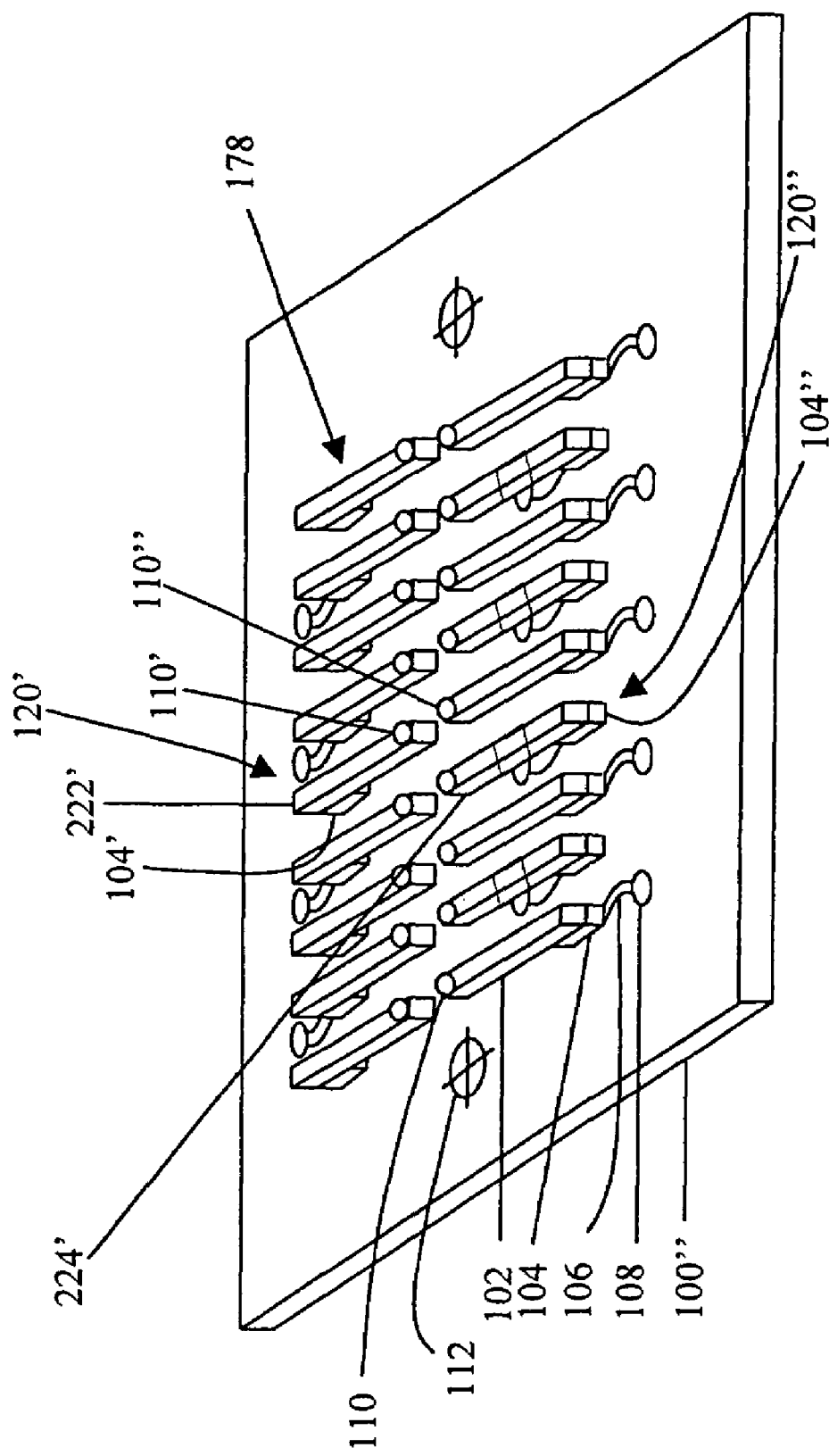

Tipped replacement beam panel 250" may be, for example, glued to beam-mounted-post structure 100' using, for example, a glue dissolvable in acetone or other like solvent. As also shown in FIG. 3B, in an exemplary embodiment of the present invention, tipped replacement beams 222', 224' may then be connected with respective posts 104', 104" at the lower surface proximate the end of replacement beams 222', 224' opposite tips 110', 110" by, for example, tab bonding at about, for example, room temperature to form replaced probes 120', 120" on beam-mounted-post substrate 100' having repaired array of beams 178. The glued structure may then be heat treated at an elevated temperature of, for example, about 100° C., for, for example about 15 hours, that may provide for optimal strengths of the tab bonds connecting tipped replacement beams 222', 224' to posts 104', 104".

The remaining tipped replacement beam panel 250" (without singulated tipped replacement beams 222', 224') may then be unglued and removed from repaired beam-mounted-post substrate 100" leaving tipped replacement beams 222', 224' connected to respective posts 104', 104" to form repaired probes 120', 120". The repaired probe panel 100" may be heated to, for example, about 250° C. for, for example, about 15 hours.

As tips 110, 110', 110" have been noted as being optional, if the tips are not employed, then the process shown in FIG. 2C and described herein need not be employed and replacement beam panel 250' shown in FIG. 2B may substitute for tipped replacement beam panel 250" in FIG. 3A and the related description herein (assuming beam 122 need be replaced).

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method for repairing a probe on a probe card, comprising:
    forming a plurality of beams on a beam panel, wherein the plurality of beams includes a replacement beam;
    after identifying a damaged beam on said probe card, removing the damaged beam from said probe card;
    aligning the beam panel with the probe card;
    after the beam panel is aligned, temporarily affixing the aligned beam panel to the probe card;
    after the beam panel is temporarily affixed to the probe card, affixing the replacement beam at a location previously occupied by said damaged beam; and
    after the replacement beam is affixed at the location, removing the beam panel from the probe card.

2. The method of claim 1, wherein the beam panel is temporarily affixed to the probe card using a dissolvable glue.

3. The method of claim 1, wherein a copper layer is applied to said beam panel prior to formation of said plurality of beams on said beam panel.

4. The method of claim 1, wherein said plurality of beam is formed on said beam panel using a plating process.

5. The method of claim 1, wherein at least a portion of beams in said plurality of beams are coated with gold on all exposed sides.

6. The method of claim 1, wherein the plurality of beams are composed of the same material as beams on the probe card.

7. The method of claim 1, wherein aligning the beam panel with the probe card comprises:
    aligning a first alignment feature on said beam panel with a second alignment feature on said probe card.

8. The method of claim 1, wherein said plurality of beams on said beam panel includes one or more additional beams which do not correspond to any damaged beams on said probe card, and wherein the method further includes removing any additional beams from the beam panel prior to aligning the beam panel with the probe card.

9. The method of claim 1, further comprising:
    prior to aligning the beam panel with the probe card, forming tips proximate to the distal ends on beams in the plurality of beams on the beam panel.

10. The method of claim 1, further comprising:
    after the beam panel is removed from the probe card, heating the probe card to about 250° C. for at least 10 hours.

* * * * *